United States Patent
Hauptner et al.

(10) Patent No.: US 7,113,015 B2
(45) Date of Patent: Sep. 26, 2006

(54) CIRCUIT FOR SETTING A SIGNAL PROPAGATION TIME FOR A SIGNAL ON A SIGNAL LINE AND METHOD FOR ASCERTAINING TIMING PARAMETERS

(75) Inventors: Lenart Hauptner, Landshut (DE); Volker Kilian, München (DE); Richard Roth, Unterhaching (DE); Stefan Sommer, Fürth (DE)

(73) Assignee: Infineon Technologies AG, Munich (DE)

( * ) Notice: Subject to any disclaimer, the term of this patent is extended or adjusted under 35 U.S.C. 154(b) by 672 days.

(21) Appl. No.: 10/291,069

(22) Filed: Nov. 8, 2002

(65) Prior Publication Data
US 2003/0086578 A1     May 8, 2003

(30) Foreign Application Priority Data
Nov. 8, 2001     (DE) .............................. 101 54 812

(51) Int. Cl.
*H03H 11/26* (2006.01)
(52) U.S. Cl. ........................... 327/276; 327/158
(58) Field of Classification Search .......... 327/149, 327/158, 161, 163, 276, 277, 278, 291, 434; 331/74; 365/233; 714/738
See application file for complete search history.

(56) References Cited

U.S. PATENT DOCUMENTS

| | | | |
|---|---|---|---|
| 5,946,268 A * | 8/1999 | Iwamoto et al. ............ 365/233 |
| 5,964,884 A | 10/1999 | Partovi et al. .............. 713/503 |
| 6,029,250 A | 2/2000 | Keeth .......................... 713/400 |
| 6,081,142 A * | 6/2000 | Douchi et al. .............. 327/158 |
| 6,205,064 B1 * | 3/2001 | Ooishi ........................ 365/200 |
| 6,229,363 B1 | 5/2001 | Eto et al. .................... 327/158 |
| 6,242,954 B1 | 6/2001 | Taniguchi et al. .......... 327/149 |
| 6,339,553 B1 | 1/2002 | Kuge .......................... 365/194 |
| 6,480,071 B1 * | 11/2002 | Fujii et al. .................... 331/74 |
| 6,556,063 B1 * | 4/2003 | Wyland ...................... 327/434 |
| 6,769,082 B1 * | 7/2004 | Okayasu et al. ............ 714/738 |

FOREIGN PATENT DOCUMENTS

| | | |
|---|---|---|
| DE | 100 43 650 A1 | 3/2001 |
| WO | 98/15058 A1 | 4/1998 |

* cited by examiner

*Primary Examiner*—Linh My Nguyen
(74) *Attorney, Agent, or Firm*—Laurence A. Greenberg; Werner H. Stemer; Ralph E. Locher

(57) ABSTRACT

A tuning circuit for setting a signal propagation time on a signal line in an integrated circuit, particularly a DRAM circuit, has a transistor and a capacitor. A control connection of the transistor is connected to a control unit for the purpose of switchably connecting the capacitor to the signal line through the transistor in order to set the signal propagation time on the signal line on the basis of application of a control signal, generated in the control unit, to the control connection on the transistor.

17 Claims, 2 Drawing Sheets

CIRCUIT FOR SETTING A SIGNAL PROPAGATION TIME FOR A SIGNAL ON A SIGNAL LINE AND METHOD FOR ASCERTAINING TIMING PARAMETERS

BACKGROUND OF THE INVENTION

Field of the Invention

The invention relates to a circuit for setting a signal propagation time on a signal line and to a method for ascertaining timing parameters in an integrated circuit.

The specific setting of propagation times for on-chip signals on an integrated circuit is generally possible only using additional circuit elements which are integrated in the integrated circuit specifically for this purpose. The propagation times of on-chip signals need to be manipulated in order to ensure the correct operation of particular circuit components, in which timing is normally critical. In this case, the propagation times are generally set by on-chip delay circuits which influence the relative delays of particular signals in the manner required.

In order to characterize an integrated circuit, specific manipulation of individual internal signal propagation times is often necessary. This is generally not possible or is possible only using very complex and time-consuming methods which, in an unfavorable situation, also alter attributes other than the desired chip attribute and are often not very easy to reproduce either. By way of example, the focused ion beam method allows circuit interconnects to be removed or applied using an ion beam. Interconnects are applied using an ion beam which is focused close to the area on which an interconnect needs to be deposited, this involving a reactive gas present at that point being decomposed and a conductive material being deposited on the surface of the integrated circuit as a result. This method is time-consuming and can be carried out only with special complexity and using specific appliances.

In the production test, particular specification values for the integrated circuit need to be checked. These include, inter alia, a series of timing parameters, e.g. setup and hold times in a memory circuit. To date, there are only external test systems that can be used to vary the timing parameters needing to be checked, in order to check the specified operating range of the integrated circuit in this way. It is thus not possible to test the range of the timing parameters in which the integrated circuit is capable of operating with sufficient accuracy.

The timing parameters, such as setup and hold times for a memory chip and for the time reference for an appropriate input signal for the memory chip, indicate the range in which the memory chip is capable of operating for the corresponding input signal. Normally, integrated circuits in which the particular timing parameters are outside a defined range have to be rejected. No provision is made for timing parameters to be aligned or modified, since the use of delay elements does not afford sufficient accuracy.

The testing of integrated circuits using an external test system is complex and cost-intensive. In particular, the measurement precision does not satisfy the requirements on account of unascertainable effects of supply and contact and the like.

Furthermore, external test systems cannot be used to gauge timing parameters relative to an on-chip clock signal.

SUMMARY OF THE INVENTION

It is accordingly an object of the invention to provide a circuit for setting a signal propagation time for a signal on a signal line and a method for ascertaining timing parameters that overcome the above-mentioned disadvantages of the prior art devices and methods of this general type, which can be used to set the signal propagation time on a signal line particularly accurately.

With the foregoing and other objects in view there is provided, in accordance with the invention, a tuning circuit for setting a signal propagation time for a signal on a signal line of integrated circuit. The tuning circuit contains a transistor connected to the signal line and has a control connection, a capacitor connected to the transistor, and a control unit generating a control signal and connected to the control connection of the transistor for switchably connecting the capacitor to the signal line through the transistor for setting the signal propagation time of the signal on the signal line on a basis of an application of the control signal, generated in the control unit, and sent to the control connection of the transistor.

A first aspect of the present invention provides a tuning circuit for setting a signal propagation time for a signal on a signal line in an integrated circuit. The tuning circuit has a transistor and a capacitor. A control connection on the transistor is connected to a control unit for the purpose of switchably connecting the capacitor to the signal line via the transistor in order to set the signal propagation time of the signal on the signal line on the basis of an application of a control signal, generated in the control unit, to the control connection on the transistor.

The advantage of the invention is that on-chip capacitances can be switchably connected to a signal line, which results in that the signal delay of a signal sent via the signal line can be altered by disconnecting and connecting the capacitance. This is done by changing the time constant determined by the resistance and capacitance of the line. The time delay is given by the gradient of the signal edge, which is dependent on the time constant.

In this way, the inventive tuning circuit allows parameters fundamental to operation to be aligned subsequently so that integrated circuits that would be rejected on account of parameter attributes which are of no use can be subsequently corrected in this manner.

If the tuning circuit is used in a DRAM circuit, it is possible to use additional capacitors that are necessary to stabilize the technology, in particular, but are not used otherwise. Such capacitors are provided, by way of example, in free areas of standard cells. The effect achieved by this is that an additional area requirement needed as a result of the tuning circuit is kept as low as possible, since only switching transistors for connecting and disconnecting the appropriate capacitors need to be provided.

Another advantage is that the inventive tuning circuit is used to manipulate on-chip signal propagation times for the purpose of measuring internal timing parameters during the production test and when characterizing integrated circuits.

Provision can also be made for the tuning circuit to contain a further transistor and a further capacitor, with a control connection on the further transistor being connected to the control unit. This allows the further capacitor to be connected to the signal line via the further transistor under the control of the control unit, in order to set the signal propagation time by applying the control signals to the control connections on the transistors. The control signals are selected so as to set the signal propagation time on the signal line in a defined manner. The provision of a plurality of transistors and capacitors connected to the signal line allows different signal propagation times to be set on the signal line. In this context, it is possible to provide capacitors having different capacitances.

Preferably, at least one of the capacitors is formed by a trench capacitor that is not provided as a storage capacitor in the integrated circuit and serves only to stabilize the technology in the case of the DRAM technology using trench capacitors that is used when manufacturing DRAMs.

The control unit can be provided both in an external test unit to which the integrated circuit is connected for test purposes and in the integrated circuit. The control unit can also contain a writable setting memory for storing a setting data item, which setting memory can have information written to it externally in order to make the control signal available on the basis of the setting data item. This allows the setting data item to be used externally, e.g. by a test unit, to prescribe a signal propagation time which is maintained until information is written to the setting memory again. If the setting memory is a permanent memory, e.g. a fuse, a signal propagation time can be prescribed permanently from the outside.

The control unit can also contain a logic circuit that can be used to produce the control signal(s). The logic circuit can be, by way of example, a test circuit that tests the integrated circuit and/or ascertains timing parameters in the integrated circuit. The value ascertained in this way is converted into control signals that are applied to the control connections. The control signals can be made available externally via one or more external connections on the integrated circuit, for example.

Provision can also be made for the control unit to contain a variable voltage source for the purpose of generating an analog control signal, the control signal containing a control voltage for actuating the transistor. In this way, the forward resistance of the transistor can be set using the control voltage, in order to influence the signal propagation time on the basis of a further parameter, namely the control voltage.

Provision can also be made for the tuning circuit to have a built-in-self-test (BIST) circuit. The BIST circuit is a circuit that is integrated in an integrated circuit, can control test cycles essentially independently and can generate test patterns. The control unit is connected to the BIST circuit for the purpose of testing the integrated circuit in a self-test procedure using various signal propagation times which can be set by the control unit. This advantageously allows a self-test procedure to be used in the integrated circuit to carry out an optimization method, e.g. iteratively, as a result of which the signal propagation time on a signal line is set to an optimum value. This is implemented, by way of example, by virtue of a test procedure being carried out successively using various set signal propagation times.

Another aspect of the present invention provides a method for ascertaining a timing parameter for an integrated circuit. This involves a test procedure which is dependent on a signal propagation time of a signal being carried out using a signal propagation time which is set by the control signal(s), with the signal propagation time being altered by setting the control signal(s) following conclusion of the test procedure, and the test procedure being carried out again, repeatedly such that the timing parameter ascertained is a signal propagation time which represents a signal propagation time limit value up to which the integrated circuit can be operated without error.

The inventive method has the advantage that altering the signal propagation time and subsequently performing a test procedure allow a signal propagation time to be discovered which represents a signal propagation time limit value up to which the integrated circuit can be operated without error.

This advantageously allows timing parameters to be ascertained which are necessary for classifying the integrated circuit and for establishing tolerance ranges and limit values. This is advantageous particularly if the signal propagation times on the signal line are altered using an on-chip test circuit, e.g. BIST circuit, in order thus to avoid complex and time-consuming testing and setting of signal propagation times using external test systems. The specification values of the integrated circuit that need to be determined in production tests can be tested in this way. As a result, external testers are relieved of load and time is saved when carrying out the test procedure.

It is also possible to achieve greater measurement precision using the inventive tuning circuit and the inventive method than when using previous methods. This is necessary particularly when measuring timing parameters, such as setup and hold times in a DRAM circuit.

In addition, the inventive circuit and method are suitable for gauging timing parameters relative to an on-chip clock signal, which is not possible using an external test unit on account of the long line connection necessary between the integrated circuit and the test unit. The on-chip reference clock signals are generally not accessible to a measurement using a test system. External test systems therefore cannot be used to measure timing parameters relative to these reference signals.

Provision can also be made for the signal propagation time to be repeatedly altered, by setting the control signal(s), such that a first timing parameter and a second timing parameter are ascertained which correspond to signal propagation times between which the test procedure produces no errors, with the test procedure producing an error outside the range formed by the signal propagation times. This method is particularly suitable for precisely ascertaining setup and hold times for a memory circuit, since the signal propagation times can be set particularly exactly using the inventive method.

Other features which are considered as characteristic for the invention are set forth in the appended claims.

Although the invention is illustrated and described herein as embodied in a circuit for setting a signal propagation time for a signal on a signal line and a method for ascertaining timing parameters, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

The invention is described using the example of a DRAM memory chip, but can be applied to any type of integrated circuit.

Figure 1:
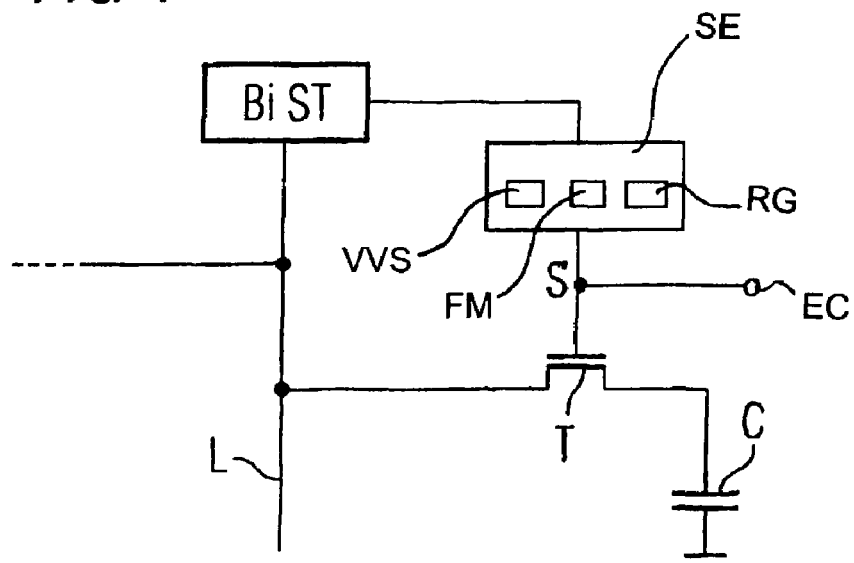
FIG. 1 is a block circuit diagram of a tuning circuit in line with a first embodiment according to the invention.

Referring now to the figures of the drawing in detail and first, particularly, to FIG. 1 thereof, there is shown a tuning circuit which can be used to set a signal propagation time on a signal line L. The signal line L is connected to a first connection of a transistor T. A second connection of the transistor T is connected to a first connection of a capacitor C. Connected to a second connection of the capacitor C is a fixed voltage potential, preferably a ground potential, particularly a fixed, i.e. invariable, voltage potential that is made available in the integrated circuit. A control connection on the transistor T is connected to a control unit SE. The control unit SE generates a control signal S that is used to actuate the transistor T.

The control signal S carries a control voltage and can be either a digital signal or an analog signal. If, in the case of a digital control signal, the control signal S can assume only the logic states "0" and "1", then the transistor T is either fully on or fully off. In this way, a capacitance of the capacitor C is present on the signal line L in one case and is not in the other case. This allows two signal propagation times to be set on the signal line L.

If the control unit generates an analog control signal S, the transistor T can be turned off or can be turned on with various forward resistances. In this way, the capacitor C can be connected to the signal line L using various resistances, which allows the signal propagation time to be varied.

The propagation time T of a signal on the signal interconnect L is dependent on a resistance R and on the capacitance C. In this case, T rises as R and C increase. Presented in a simple way, the following relationship is produced:

$$T = R \cdot C$$

In the case of the inventive circuit, the interconnect capacitance $C_L$ is altered in a controlled way by virtue of an additional capacitance $C_T$ of the capacitor C being connected. The value of the connected capacitance can be prescribed using the transistor T and the control signal S and also by a value of the capacitance $C_T$. The effective capacitance obtained is thus:

$$C_{EFF} = C_L + F \cdot C_T$$

A factor F determines the degree to which the transistor T is on, and is between 0 and 1. F is dependent on the control signal S or on its control voltage.

The capacitor C is preferably in the form of a deep trench capacitor, of which the DRAM circuit contains a large number. While the deep trench capacitors are normally used to store information, there are also a large number of "dummy deep trench capacitors" in the integrated circuit, which are used to stabilize the manufacturing process and to control it better. The dummy deep trench capacitors are generally not used for other purposes and can therefore be used for the inventive tuning circuit without the need for additional area to be provided for producing the necessary capacitance. The dummy deep trench capacitors are provided in free areas of standard cells (e.g. I/O, SRAM, logic etc.) and particularly in the actuation circuits for DRAM circuits.

Besides using the inventive tuning circuit to set signal delays for signals on signal lines, the tuning circuit can also play a significant part in characterizing integrated circuits. When characterizing integrated circuits, specific repeated manipulation of signal propagation times is often necessary in order to determine the operating tolerances of the integrated circuit. The integrated circuit can generally be manipulated only with great difficulty, e.g. using focused ion beam manipulation.

Depending on the respective configuration of an integrated circuit, there are signals with critical timing that play an important part in characterization. The signal propagation times of these signals can be altered using the inventive tuning circuit by increasing the line capacitance $C_L$ of the signal line L. This is done by altering the control signal S.

In line with the circuit shown in FIG. 1, the control signal S is preferably an analog signal that is used to control the conductivity of the transistor T. The control signal S can first be applied to the control connection on the transistor T via a connection EC connected to one or more external connections on the integrated circuit and can second be prescribed using programmable registers RG in the control unit SE. The programmable registers RG can have information written to them either from an external test unit or by built-in-self-test (BIST) logic or a state machine known to a person skilled in the art. The BIST logic or state machine can either be permanently preprogrammed or can be externally programmable.

To determine a timing parameter for the integrated circuit, a test is defined in which the test result is critically dependent on the signal which is to be characterized. This test is now carried out for a particular control signal S that corresponds to a particular signal propagation time on the signal line L. If the test is successful, the control signal S is changed, so that the signal propagation time of the signal is shifted toward another, usually less favorable value. The test is then repeated until the test no longer delivers the correct result. In this way, a timing parameter is obtained which indicates a limit value for the signal propagation time that only just allows the integrated circuit to be operated without error. This procedure can be repeated in order to determine a second limit value and thus to establish a range of signal propagation times in which the circuit can be operated without error.

This procedure for characterizing a timing parameter can be carried out on-chip under full control of the BIST circuit without the need to use control by an external test unit.

This allows a highly reproducible method of measurement and allows automatic characterization of parameters that can otherwise be accessed only with difficulty in a large number of integrated circuits.

The production test on integrated circuits requires specification values to be tested. These include, in particular, propagation time parameters, e.g. setup and hold times for the DRAM memories. This has previously been possible only using external test units that allow setting of the timing parameters that are to be checked. Testing such specification values using on-chip test logic has not been an option to date.

An integrated circuit in which particular timing parameters, such as setup and hold times, are not within predetermined limits normally have to be rejected. The inventive tuning circuit makes it possible to manipulate the timing parameters in order to obtain an integrated circuit whose specification values are within the desired range.

In a case in which hold time problems arise for an input signal in an integrated DRAM memory circuit, but where the setup time is not critical, delaying the input signal on a corresponding signal line L, e.g. a data signal line in the DRAM memory circuit, can put the corresponding timing parameter for the integrated circuit within the range determined by the specification. The controlled connection of the capacitance $C_T$ allows the delay of the signal on the signal line to be set precisely. To this end, the control signal S applied to the transistor T needs to be able to be adjusted very exactly. To make the control signal S determined in this manner permanently available for the corresponding signal line, it is appropriate to provide "fuses" as setting memories FM that are used to store a setting value that corresponds to a particular value of the control signal S.

The optimum control signal S can be ascertained iteratively or by another optimization method, for example.

Figure 2:
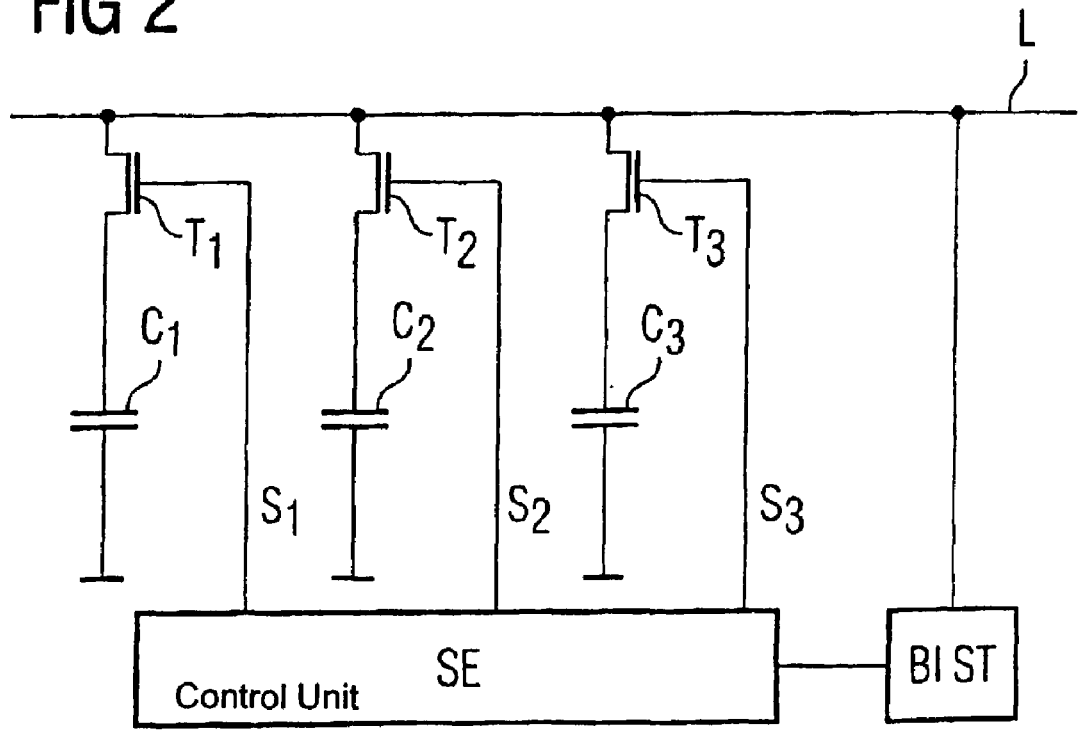
FIG. 2 is a block circuit diagram of the tuning circuit in line with another exemplary embodiment of the invention.

FIG. 2 shows a circuit in line with another embodiment of the invention. It has a plurality of transistors $T_1$, $T_2$, $T_3$ and a plurality of capacitors $C_1$, $C_2$ and $C_3$. The transistors and capacitors are respectively connected in series and are connected to the signal line L. Control connections on the transistors $T_1$, $T_2$, $T_3$ are connected to the control unit SE. In this embodiment, the signal propagation time on the signal line L is set on the basis of digital control signals $S_1$, $S_2$, $S_3$. There is no need for a variable, analog voltage source VVS as in the exemplary embodiment shown in FIG. 1 to be provided in this case, which results in that the area requirement can be reduced. The provision of capacitors $C_1$, $C_2$, $C_3$ having various capacitances or the connection of a plurality of capacitors in parallel allows the signal propagation times on the signal line L to be set over a wide range and with a high level of accuracy, the accuracy being dependent on the number of transistor-capacitor elements used.

The effective capacitance produced is thus:

$$C_{EFF} \simeq C_L + F_1 \cdot C_1 + F_2 \cdot C_2 + F_3 \cdot C_3.$$

In this case, the factors $F_1$, $F_2$, $F_3$ are either 0 or 1, depending on the control signal $S_1$, $S_2$, $S_3$.

Figure 3:
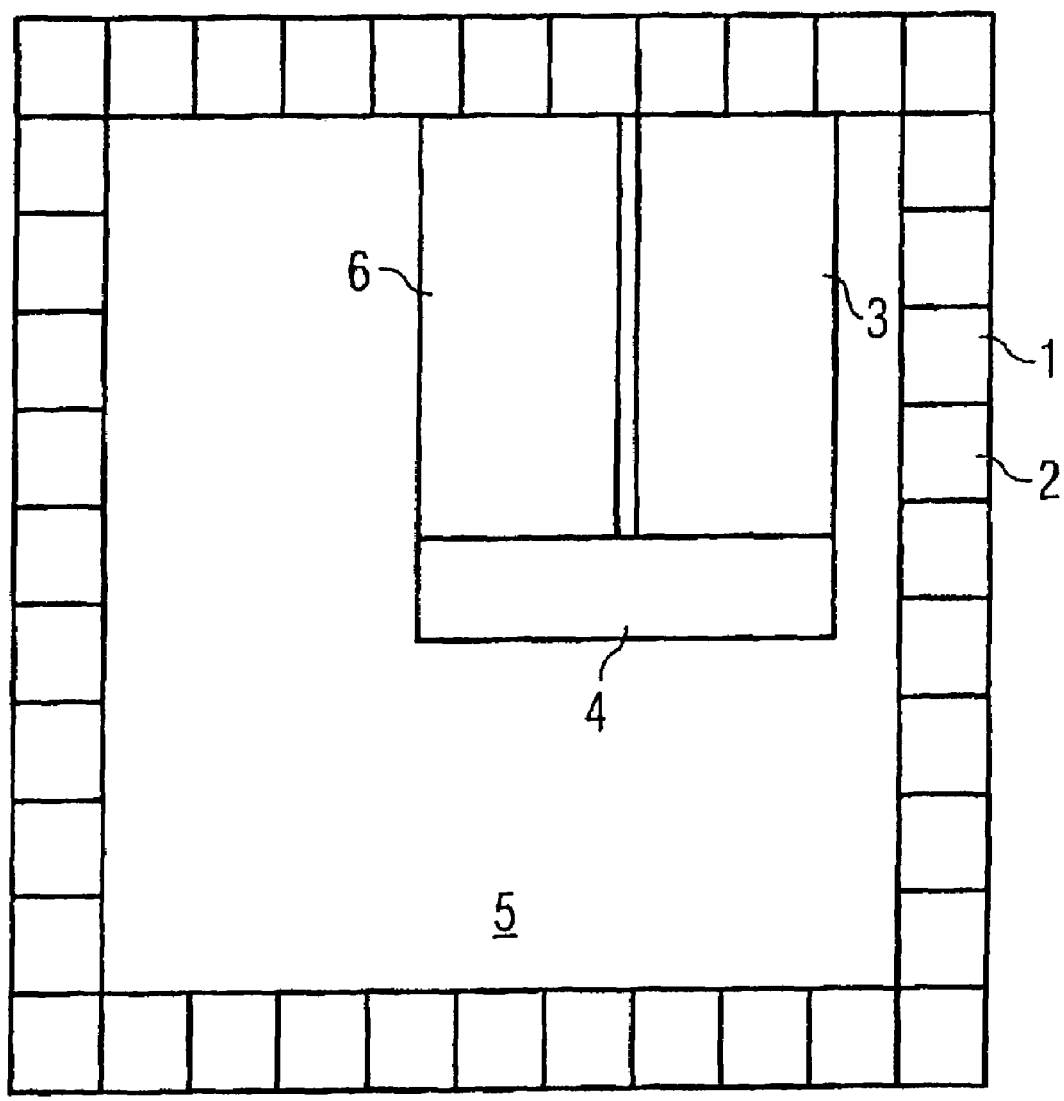
FIG. 3 is a schematic illustration of a configuration of circuits in an integrated circuit.

FIG. 3 schematically shows a configuration of circuits in an integrated circuit 1. At an edge of the integrated circuit 1 there are input/output circuits 2. The integrated circuit 1 also has two DRAM memory areas 3 which can be actuated using an interface circuit 4. The remaining areas not required by the DRAM circuit and by the interface circuit 4 can be taken up by logic circuits 5, for example. Generally, the interface circuits 4 and the logic circuits 5 are made up of standard circuit elements, with unoccupied areas being able to be formed, depending on the layout. The unoccupied surface areas are fitted with trench capacitors, for the purpose of stabilizing the technology, which are generally unused and are not in electrical contact with the logic circuits.

The logic circuits 5 are now provided with additional transistors which are disposed particularly in the vicinity of signal lines whose signal delay times need to be able to be set. While the connections of the unused trench capacitances are normally kept at a fixed predetermined potential, the trench capacitances used for setting the delay time have at least one connection connected via the corresponding transistor to one of the signal lines which need to be influenced. In this case, trench capacitances that are further away from the respective signal lines can also be used, since the connecting line between the trench capacitance and the respective signal line to be influenced merely increases the effective capacitance that is to be applied to the signal line.

We claim:

1. A tuning circuit for setting a signal propagation time for a signal on a signal line of an integrated circuit, the tuning circuit comprising:
   a transistor connected to the signal line and having a control connection;
   a capacitor connected to said transistor, said capacitor being a trench capacitor and not being used for storing information; and
   a control unit generating a control signal and connected to said control connection of said transistor for switchably connecting said capacitor to the signal line through said transistor for setting the signal propagation time of the signal on the signal line on a basis of an application of the control signal, generated in said control unit, and sent to said control connection of said transistor.

2. The tuning circuit according to claim 1, wherein said, control unit applies a control voltage to said control connection as the control signal.

3. The tuning circuit according to claim 1, further comprising:
   a further transistor connected to the signal line and having a control connection; and
   a further capacitor connected to said further transistor, said control connection of said further transistor connected to said control unit for connecting said further capacitor to the signal line through said further transistor under control of said control unit for setting the signal propagation time by applying control signals, generated by said control unit, to said control connection of said transistor and of said further transistor.

4. A tuning circuit for setting a signal propagation time for a signal on a signal line of an integrated circuit, the tuning circuit comprising:
   a transistor connected to the signal line and having a control connection;
   a capacitor connected to said transistor;
   a control unit generating a control signal and connected to said control connection of said transistor for switchably connecting said capacitor to the signal line through said transistor for setting the signal propagation time of the signal on the signal line on a basis of an application of the control signal, generated in said control unit, and sent to said control connection of said transistor;
   a further transistor connected to the signal line and having a control connection; and
   a further capacitor connected to said further transistor, said control connection of said further transistor connected to said control unit for connecting said further capacitor to the signal line through said further transistor under control of said control unit for setting the signal propagation time by applying control signals, generated by said control unit, to said control connection of said transistor and of said further transistor, at least one of said capacitor and said further capacitor is a trench capacitor not being used for storing information.

5. The tuning circuit according to claim 1, wherein the tuning circuit can be connected to an external test unit.

6. The tuning circuit according to claim 5, wherein the external test unit contains said control unit.

7. The tuning circuit according to claim 1, wherein said control unit is part of the integrated circuit.

8. The tuning circuit according to claim 7, wherein said control unit contains a writable setting memory for storing a setting data item, said writable setting memory being able to have information written to it by external signals.

9. The tuning circuit according to claim 7, wherein said control unit contains a logic circuit for producing the control signal.

10. The tuning circuit according to claim 7, further comprising a connection connected to at least one external connection on the integrated circuit for receiving the control signal externally.

11. A tuning circuit for setting a signal propagation time for a signal on a signal line of an integrated circuit, the tuning circuit comprising:
   a transistor connected to the signal line and having a control connection;
   a capacitor connected to said transistor; and
   a control unit generating a control signal and connected to said control connection of said transistor for switchably connecting said capacitor to the signal line through said transistor for setting the signal propagation time of the signal on the signal line on a basis of an application of the control signal, generated in said control unit, and sent to said control connection of said transistor, said control unit containing a variable voltage source for generating the control signal, the control signal being a control voltage for actuating said transistor.

12. A tuning circuit for setting a signal propagation time for a signal on a signal line of an integrated circuit, the tuning circuit comprising:
   a transistor connected to the signal line and having a control connection;
   a capacitor connected to said transistor; and
   a control unit generating a control signal and connected to said control connection of said transistor for switchably connecting said capacitor to the signal line through said transistor for setting the signal propagation time of the signal on the signal line on a basis of an application of the control signal, generated in said control unit, and sent to said control connection of said transistor, said control unit containing a fuse memory cell for permanently storing the control signals following an optimization step.

13. A tuning circuit for setting a signal propagation time for a signal on a signal line of an integrated circuit, the tuning circuit comprising:
   a transistor connected to the signal line and having a control connection;
   a capacitor connected to said transistor;
   a control unit generating a control signal and connected to said control connection of said transistor for switchably connecting said capacitor to the signal line through said transistor for setting the signal propagation time of the signal on the signal line on a basis of an application of the control signal, generated in said control unit, and sent to said control connection of said transistor; and
   a built-in-self-test circuit connected to said control unit, said built-in-self-test circuit testing the integrated circuit in a self-test procedure using various signal propagation times set by said control unit.

14. The tuning circuit according to claim 7, wherein said control unit contains a writable setting memory for storing a setting data item, said writable setting memory being able to have information written to it by external signals making the control signal available on a basis of the setting data item.

15. The tuning circuit according to claim 7, wherein the integrated circuit is a dynamic random access memory circuit.

16. A method for ascertaining a timing parameter of a signal on a signal line of an integrated circuit having a tuning circuit, the tuning circuit containing:
   a transistor connected to the signal line and having a control connection;
   a capacitor connected to the transistor; and
   a control unit generating a control signal and connected to the control connection of the transistor for switchably connecting the capacitor to the signal line through the transistor for setting a signal propagation time of the signal on the signal line on a basis of an application of the control signal, generated in the control unit, and sent to the control connection of the transistor;
   the method comprises the steps of:
   carrying out a test procedure dependent on the signal propagation time of the signal by using the control signal to set the signal propagation time;
   altering the signal propagation time by resetting the control signal following an end of the test procedure;
   carrying out the test procedure again, repeatedly such that the timing parameter ascertained is a final signal propagation time representing a signal propagation time limit value up to which the integrated circuit can be operated without error; and
   repeatedly altering the signal propagation time by resetting the control signal such that a first timing parameter and a second timing parameter are ascertained which are signal propagation times between which the test procedure produces no errors, with the test procedure producing an error outside a range formed by the signal propagation times.

17. A method for ascertaining a timing parameter of a signal on a signal line of an integrated circuit having a tuning circuit, the tuning circuit containing:
   a transistor connected to the signal line and having a control connection;
   a capacitor connected to the transistor; and
   a control unit generating a control signal and connected to the control connection of the transistor for switchably connecting the capacitor to the signal line through the transistor for setting a signal propagation time of the signal on the signal line on a basis of an application of the control signal, generated in the control unit, and sent to the control connection of the transistor;
   the method comprises the steps of:
   carrying out a test procedure dependent on the signal propagation time of the signal by using the control signal to set the signal propagation time;
   altering the signal propagation time by resetting the control signal following an end of the test procedure; and
   carrying out the test procedure again, repeatedly such that the timing parameter ascertained is a final signal propagation time representing a signal propagation time limit value up to which the integrated circuit can be operated without error, the timing parameter ascertained is one of a setup time and hold time for a memory circuit.

* * * * *